(12) United States Patent
Steensgaard-Madsen

(10) Patent No.: US 6,215,348 B1
(45) Date of Patent: Apr. 10, 2001

(54) BOOTSTRAPPED LOW-VOLTAGE SWITCH

(76) Inventor: Jesper Steensgaard-Madsen, 426 NW. 15th St., Apt #1, Corvallis, OR (US) 97330

(*) Notice: Subject to any disclaimer, the term of this patent is extended or adjusted under 35 U.S.C. 154(b) by 0 days.

(21) Appl. No.: 09/163,533

(22) Filed: Sep. 30, 1998

Related U.S. Application Data

(60) Provisional application No. 60/060,735, filed on Oct. 1, 1997.

(51) Int. Cl.[7] .................................... H03K 17/16
(52) U.S. Cl. .......................... 327/390; 327/589
(58) Field of Search ..................... 327/589, 390, 327/534, 535, 536, 537, 391; 326/88

(56) References Cited

U.S. PATENT DOCUMENTS

| | | | |
|---|---|---|---|
| 3,955,103 | 5/1976 | Russell et al. | 307/251 |
| 4,093,874 | 6/1978 | Pollitt | 307/251 |
| 4,473,761 | 9/1984 | Peterson | 307/579 |
| 4,529,897 | 7/1985 | Suzuki et al. | 307/571 |
| 4,716,319 | 12/1987 | Rebeschini | 307/520 |
| 5,500,612 | 3/1996 | Sauer | 327/91 |
| 5,923,204 | * 7/1999 | Rapeli et al. | 327/337 |
| 5,999,459 | * 12/1999 | Liu | 365/189.06 |

OTHER PUBLICATIONS

Delta–Sigma Data Converters, 1996, S. Norsworthy R. Schreier, G. Temes, (editors), Figures 11.6 and 11.7, IEEE Press ISBN 0–7803–1045–4, Section 11.3 pp. 336–343.

* cited by examiner

*Primary Examiner*—Toan Tran
*Assistant Examiner*—Hiep Nguyen

(57) ABSTRACT

A low-voltage constant-impedance analog switch based on a single MOSFET [328] as the main switching element. The constant-impedance on-state operation is obtained by connecting a charged capacitor [326] between the gate and source terminals of the MOSFET [328]. The switch can be compensated for the body effect, which may be necessary to obtain the required level of linearity. Low-voltage operation is made feasible by employing an internal feedback loop that locks in the switch's on-state. The switch can be implemented in a single-well CMOS bulk technology, and it can operate at supply-voltage differences that are only slightly higher than the technology's threshold voltage.

21 Claims, 9 Drawing Sheets

BOOTSTRAPPED LOW-VOLTAGE SWITCH

1 BACKGROUND: FIELD OF INVENTION

1.1 Related Application Data

This application is based on and claims priority from U.S. Provisional Patent Application Ser. No. 60/060,735, filed Oct. 1, 1997.

This invention relates to switches for use in partly-analog integrated circuits. More particularly, this invention relates to low-voltage analog switches operating with constant overdrive.

2 BACKGROUND: DESCRIPTION OF PRIOR ART

Analog switches are used in various electrical circuits such as: multiplexers, sample-and-hold (S/H) circuits, analog-to-digital converters (ADCs), digital-to-analog converters (DACs), and in particular in discrete-time analog systems such as switched-capacitor (SC) and switched-current (SI) circuits.

2.1 An Analog Switch

Figure 1:
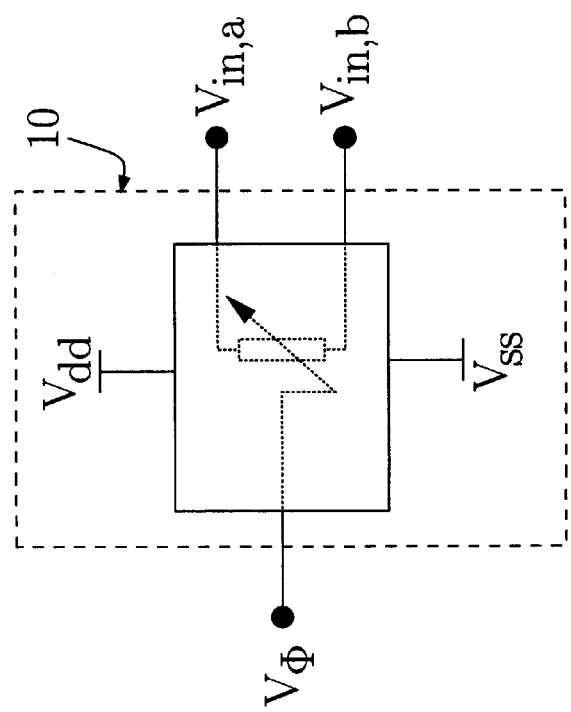

An analog switch is a controllable two-terminal device as illustrated in FIG. 1. It will typically have two states: an "on-state" and an "off-state." In the on-state, the analog switch should short circuit the two switch terminals, labeled $V_{in,a}$ and $V_{in,b}$ in the Figures. In the off-state, the analog switch should disconnect the two switch terminals. In neither state should the analog-switch circuit load the switch terminals. The state of the analog switch is usually controlled by a third terminal: the control terminal, labeled $V_\Phi$ in the Figures.

An analog switch may require power to operate. In that case, a high ($V_{dd}$) and a low ($V_{ss}$) supply potential must be supplied.

2.2 A MOSFET-Based Switch

MOSFETs (Metal-Oxide-Semiconductor Field-Effect-Transistors), also known as IGFETs (Insulated-Gate Field-Effect-Transistors), are by themselves analog switches. Current can flow between the two switch terminals (the drain and the source terminals) if, and only if, the gate has a sufficiently high potential (for NMOS, i.e. N channel MOSFETS) to form a conductive channel under the gate area.

The stand-alone MOSFET switch is passive, i.e. it does not require external power to perform the switching operation. MOSFET switches are, however, not straightforward to control, because the potential of the control terminal (the gate terminal) must be adjusted relative to the channel potential to obtain linear behavior. A power-consuming circuit is often required to generate an appropriate signal to control the MOSFET-based analog switch.

2.3 Linearizing the MOSFET Switch

A good switch should in its on-state provide conductance that is independent of the signal it is conducting. A MOSFET's drain-to-source conductance is (when the drain-to-source voltage is zero) proportional to the charge accumulated in the channel. As described by C. Enz, K. Krummennacher, and E. Vittoz in *Analog Integrated Circuits and Signal Processing*, vol. 8, no. 1, July 1995, pp. 83–114, the channel charge has a nonlinear dependence on the relative potentials of all 4 MOSFET terminals: gate, drain, source, and bulk. In the switch's on-state, the drain and source terminals should have essentially the same potential. Hence, the problem is described by only three variables: the gate, channel, and bulk potentials. The channel potential is determined by the signal the switch is conducting, i.e. the switch can be controlled only by adjusting the gate and bulk potentials.

A NMOS requires a minimum gate-to-channel voltage (the threshold voltage), to be able to conduct. If the gate-to-channel voltage is raised beyond this level, the switch's conductance will increase. The threshold voltage is somewhat dependent on the bulk-to-channel voltage. This dependence is often referred to as the "body effect." A PMOS (P-channel MOSFET) has the same behavior, but with the opposite polarity.

To assure that the MOSFET-based analog switch has a reasonably constant (signal-independent) conductance, it is necessary to compensate for the gate-to-channel voltage dependence. Whether or not it is necessary to compensate for the body effect depends on the application, the supply-voltage difference, and other design specifications.

2.3.1 Constant-Overdrive MOSFET Switches

The principle of constant-overdrive MOSFET switches is that the gate-to-drain voltage (or equivalent, the gate-to-source voltage) in the on-state is controlled to a constant value. This technique is described in U.S. Pat. Nos. 3,955,103 and 4,093,874. These circuits are, however, not suitable for implementation as integrated circuits. They require components that are no longer available in standard CMOS technologies, and they need a fairly high supply-voltage difference to operate.

2.3.2 Body-Effect-Compensated MOSFET Switches

The body effect can in many cases be thought off as a second-order effect. However, when the supply-voltage difference (and thereby the feasible overdrive of the MOSFET) is reduced, the body effect will play a more dominant role (due to an only partial depletion of the substrate/body). Some techniques to avoid or compensate for the body effect are known.

A brute-force method would be to use a SOI (silicon-on-insulator) technology. The substrate of such technologies is typically so thin that the body effect is negligible. This option may become relevant for mass-produced systems, but currently it is considered to be an exotic approach.

In a traditional bulk technology, in which the MOSFETs are realized as diffusions in a common substrate, it may be possible to compensate for the body effect. The technique requires that the MOSFET switch is implemented in a separate well. By biasing the well properly, the body effect can be eliminated. This technique is known as the "back-gate" or "switched-tub" technique, and it is taught in U.S. Pat. Nos. 4,473,761 and 4,529,897. An advantage of this technique is that the threshold voltage is held (constant) at its "minimum." Hence, the technique is well-suited for use in low-voltage systems. An idealized version is discussed in the book "Delta-Sigma Data Converters," edited by S. Norsworthy, R. Schreier, and G. Temes, *IEEE Press*, 1996, FIG. 11.6.

2.3.3 Constant-Overdrive Switches for use in Low-Voltage Systems

The maximum supply-voltage difference permissible for use in last-generation integrated-circuits technologies is scaled down each year. Hence, there is a great demand for an analog switch that can operate with a low supply-voltage difference and that can conduct signals in the rail-to-rail range. The requirement of rail-to-rail operation, combined with the constant-overdrive-MOSFET approach, leads to the conclusion that the gate potential unavoidably must exceed one of the supply rails (for enhancement MOSFETs). Hence, it is necessary to either boost the supply-voltage difference or use a signal-dependent clock booster.

Figure 2:
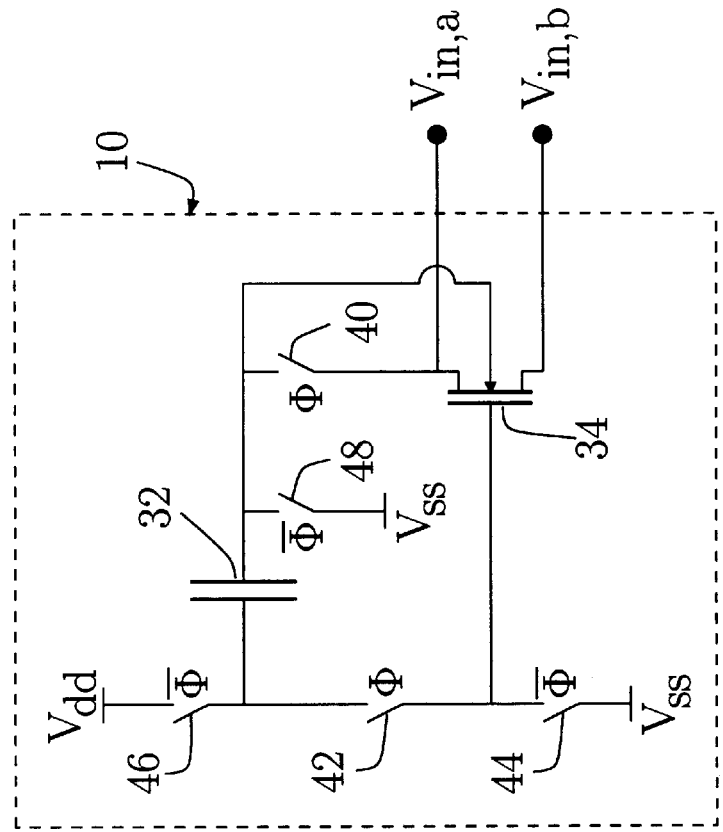

2.4 Prior Art: FIG. 2

The basic principle of operation of a constant-overdrive switch is shown in FIG. 11.7 in the book "Delta-Sigma Data Converters." The figure omits many details, so it has been interpreted. The interpretation is shown in FIG. 2.

The off-state (clock phase $\overline{\Phi}$): The gate terminal of the main switch element, NMOS [34], is connected to the low supply potential $V_{ss}$ via an internal switch [44]. This assures that the two switch terminals, $V_{in,a}$ and $V_{in,b}$, are not provided a conductive path through the switch [10], assuming that their potentials are higher than the low supply potential $V_{ss}$.

The bootstrap capacitor [32] is charged via internal switches [46] and [48], as preparation for use in the on-state. The voltage thereby stored on the bootstrap capacitor will equal the supply-voltage difference $$V_{sup} = V_{dd} - V_{ss}$$

The on-state (clock phase $\Phi$): The state of the internal switches [40] [42] [44] [46] [48] are all alternated, such that the bootstrap capacitor [32] is coupled between the first switch terminal ($V_{in,a}$) and the MOSFET's [34] gate terminal. The bootstrap capacitor [32] does not have a current path to discharge through, so the overdrive of the MOSFET [34] will be constant. Hence, the MOSFET [34] will provide a current path between the two switch terminals, $V_{in,a}$ and $V_{in,b}$, which has an approximately constant conductance.

The bulk terminal of the MOSFET [34] may be connected to the low supply potential $V_{ss}$, but to cancel the body effect, it is preferable to connect it to the common node of the internal switches [40] and [48] (as shown in FIG. 2). However, if the analog-switch circuit is implemented in a single-well technology, this configuration may unfortunately not be an option. The problem lies in implementing the internal switches to provide the described operation.

2.4.1 Implementing the Circuit

A simple inspection of the switch [10] shown in FIG. 2 will show that the internal switch [40] has to perform the same switching operation as the analog-switch circuit [10]. They conduct simultaneously, and when conducting they are applied the same signal. An advantage to the analog-witch circuit [10] is that it will provide an constant-conductance connection (due to the constant overdrive of the main MOSFET [34]), even if the internal switch [40] does not. The main requirement to the internal switch [40] is that it must charge the capacitive load constituted by the gate terminal of the MOSFET [34] when the switch [10] is turned on. Providing that this operation occurs fast, the linearity of the internal switch [40] is not important. Hence, there is a minimum requirement to the internal switch's [40] conductance, but not to its linearity. Because the switch [40] is loaded by an only small capacitive load, the required minimum value of its conductance is relaxed. Hence, the concept illustrated in FIG. 2 is good, but only very few implementations of the scheme have been published.

One way to implement a somewhat similar analog-switch circuit is taught by Donald Sauer in U.S Pat. No. 5,500,612. He teaches a technique where the internal switches [42] [44] [46] are replaced by a charging sequence. However, he does not show how to implement the internal switch [40]. This is unfortunate, because it is the implementation of this internal switch [40] that is the main difficulty when designing the analog-switch circuit for operation with a low supply-voltage difference. Other elements of this scheme also require a fairly high supply-voltage difference. Hence, his analog-switch circuit is not suitable for low-voltage applications. It is another disadvantage is that the bootstrap capacitor is charged and discharged in every clock cycle. This mode of operation increases the power consumption, and it requires use of low-impedance internal switches.

2.4.2 Implementing Low-Voltage Switches

As discussed, the internal switch [40] is difficult to implement when the supply-voltage difference is low. The difficulty is due to the required rail-to-rail range operation. When the supply-voltage difference is less than the sum of the NMOS threshold voltage and the absolute value of the PMOS threshold voltage, a standard CMOS transmission-gate analog switch will not be able to conduct signals in the midrange region. To obtain reliable conduction, it is necessary to boost at least one clock signal beyond the supply rails. Simple clock doublers are taught by Nakano, Baba, and Mochizuki in U.S. Pat. No. 4,382,194; by Cho and Gray in *Proc. IEEE Custom IC Conf.*, pp. 23.2.1–23.2.4, May 1994; and by several others. The use of clock doublers is, however, associated with a serious disadvantage:

- The gate oxide of a MOSFET switch controlled by a doubled clock signal will have up to twice the supply-voltage difference applied across it.
- Large voltages applied across the gate oxide becomes increasingly more unacceptable as the continued downscaling of the technologies takes place. The ever thinner gate oxide will thereby be subject to a very large electrical field, which will cause an early deterioration or breakdown of the oxide.

The schematic presented in FIG. 11.7 in the book "Delta-Sigma Data Converters" supposedly represents an analog-switch circuit implemented with internal switches controlled by doubled clock signals. Such circuits can be implemented only in dual-well technologies, and they will be outdated when the gate oxide becomes unable to withstand the thereby applied electric fields.

Figure 3:
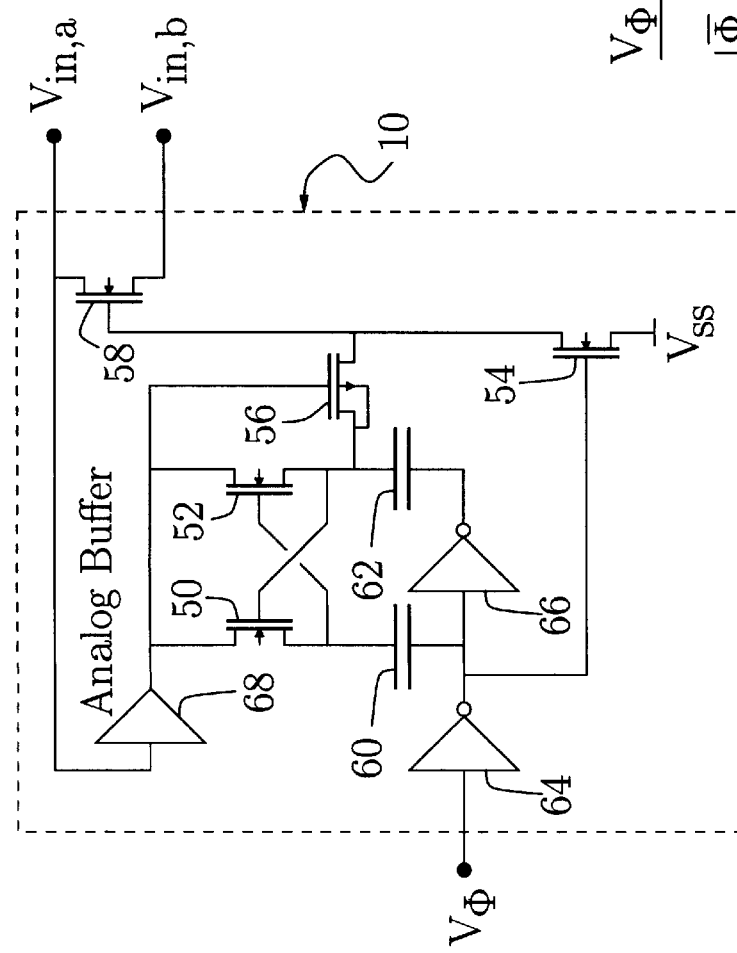

2.5 Prior Art: FIG. 3

The analog-switch circuit shown in FIG. 3 was presented by Todd L. Brooks during Session FP13.1 at the 1997 *IEEE International Solid-State Circuit Conference*, and it has since been published in *IEEE Journal of Solid-State Circuits*, vol. 32, no.12, December 1997.

The analog input signal, applied to the first switch terminal $V_{in,a}$, is during the off-state sampled on a bootstrap capacitor [62]. In the transition to the on-state, the potential of the capacitor [62] is shifted upwards by a voltage equal to the supply-voltage difference, and the capacitor terminal with the highest potential is via MOSFET [56] connected to the gate terminal of the MOSFET switch [58]. The overdrive of the MOSFET [58] will be constant only if the input signal $V_{in,a}$ does not change from the sampling instance (the end of the off-state) and during the on-state. If the supply-voltage difference is only slightly higher than the MOSFET's [58] threshold voltage, even a small change in the MOSFET's [58] overdrive will cause significant relative variation of its conductance. If the analog-switch circuit [10] is used to sample a continuous-time analog signal, the overdrive will not be constant and sampling nonlinearity will result. Even when the supply-voltage difference is fairly high, the analog-switch circuit's [10] performance will suffer greatly if the input signal $V_{in,a}$ has significant spectral components around the Nyquist frequency. Hence, this analog-switch circuit is not suitable for such purposes. In an oversampled environment, such as the application for which the switch was designed, the above nonidealities may be tolerated.

The disadvantages of the switch shown in FIG. 3 include the following:

The one-clock-phase delay limits the type of applications for which the switch is useful.

The clock booster loads the first switch terminal $V_{in,a}$ with the bootstrap capacitor(s). To avoid this large capacitive load directly on the input, an analog buffer [68] may be used as isolation. This buffer [68] is, however, power-consuming and difficult to implement when the supply-voltage difference is low.

The main switch element (NMOS [58]) is not compensated for the body effect. Due to the requirement of a separate well for PMOS [56], this feature cannot be implemented in a single-well technology.

3 OBJECTS AND ADVANTAGES

Accordingly, it is an object of this invention to provide analog switches that can be implemented as integrated circuits possibly operating with a very low supply-voltage difference. In particular, it is an object to provide analog switches that are not subject to the foregoing disadvantages. Several other objects and advantages of the present invention are 1. To provide analog switches that can operate with a supply-voltage difference that is only slightly greater than the threshold voltage.
2. To provide analog switches that can be implemented in a basic CMOS technology.
3. To provide analog switches that can be compensated for the body effect, even when implemented in single-well technologies.
4. To provide analog switches providing signal-independent conductance in the rail-to-rail range.
5. To provide MOSFET-based analog-switch circuits, for which the gate oxides is not subject to voltages that are significantly higher than the supply-voltage difference.

Further objects and advantages of the invention will become apparent from a consideration of the Figures, the ensuing description, and the claims.

4 DRAWING FIGURES

FIG. 1: PRIOR ART. Shows a general model of an analog switch.

FIG. 2: PRIOR ART. Shows the general principle of a MOSFET-based analog-switch circuit, which is compensated for the body effect, and which in the on-state operates with a constant overdrive.

FIG. 3: PRIOR ART. Shows the implementation of a MOSFET-based analog-switch circuit.

Figure 4:
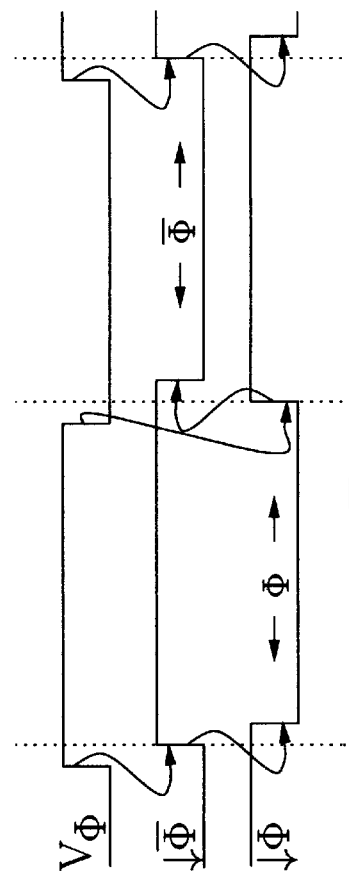

FIG. 4: Shows the control signal $V_\Phi$ and the non-overlapping clock signals ($\downarrow\Phi$) and ($\downarrow\overline{\Phi}$) defining the on-state and the off-state.

Figure 5A:
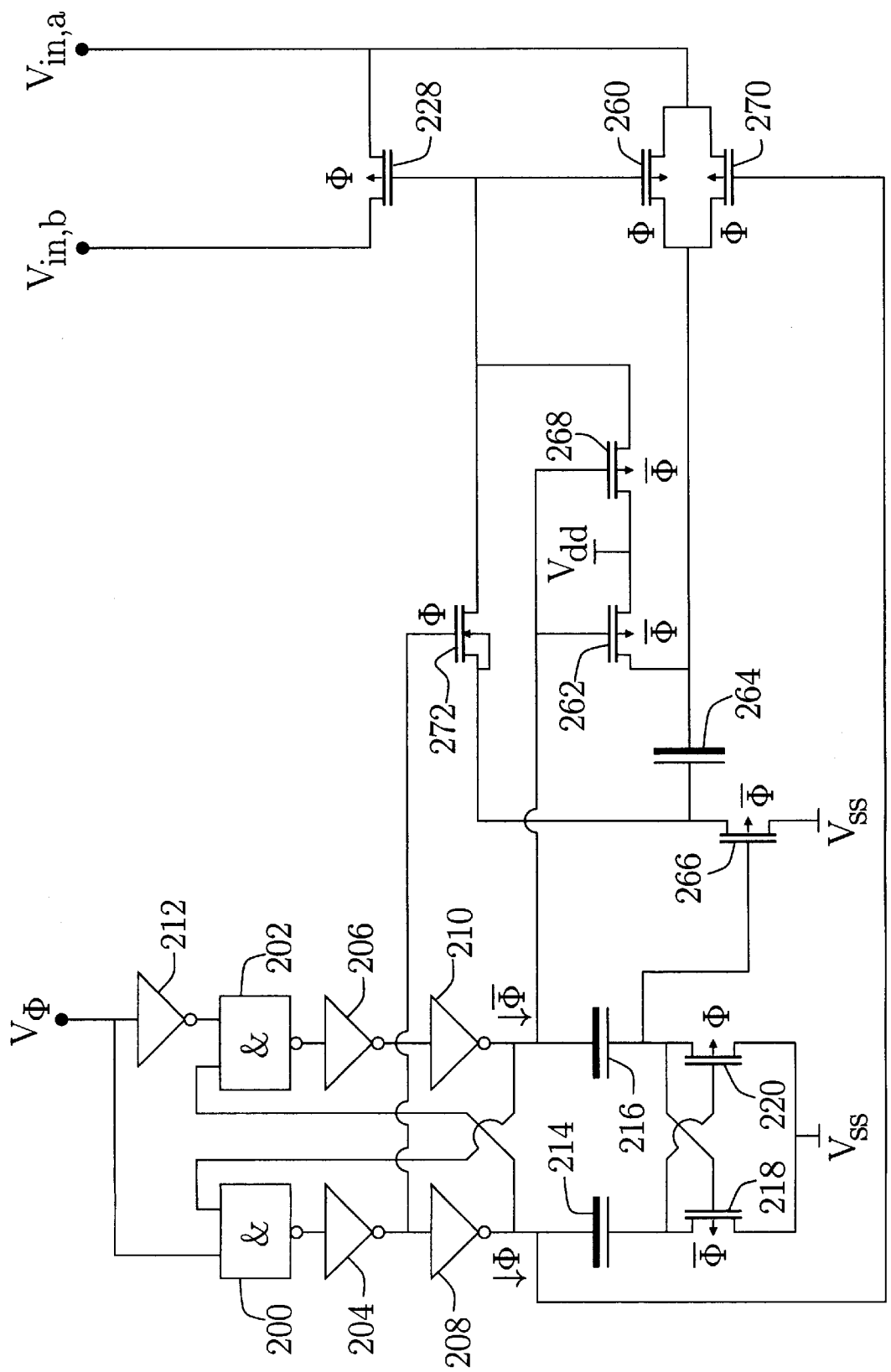

FIG. 5A: Shows a novel implementation of the analog-switch circuit shown in FIG. 2. The internal switch [40] is implemented such that the circuit [10] can operate with a very low supply-voltage difference.

Figure 5B:
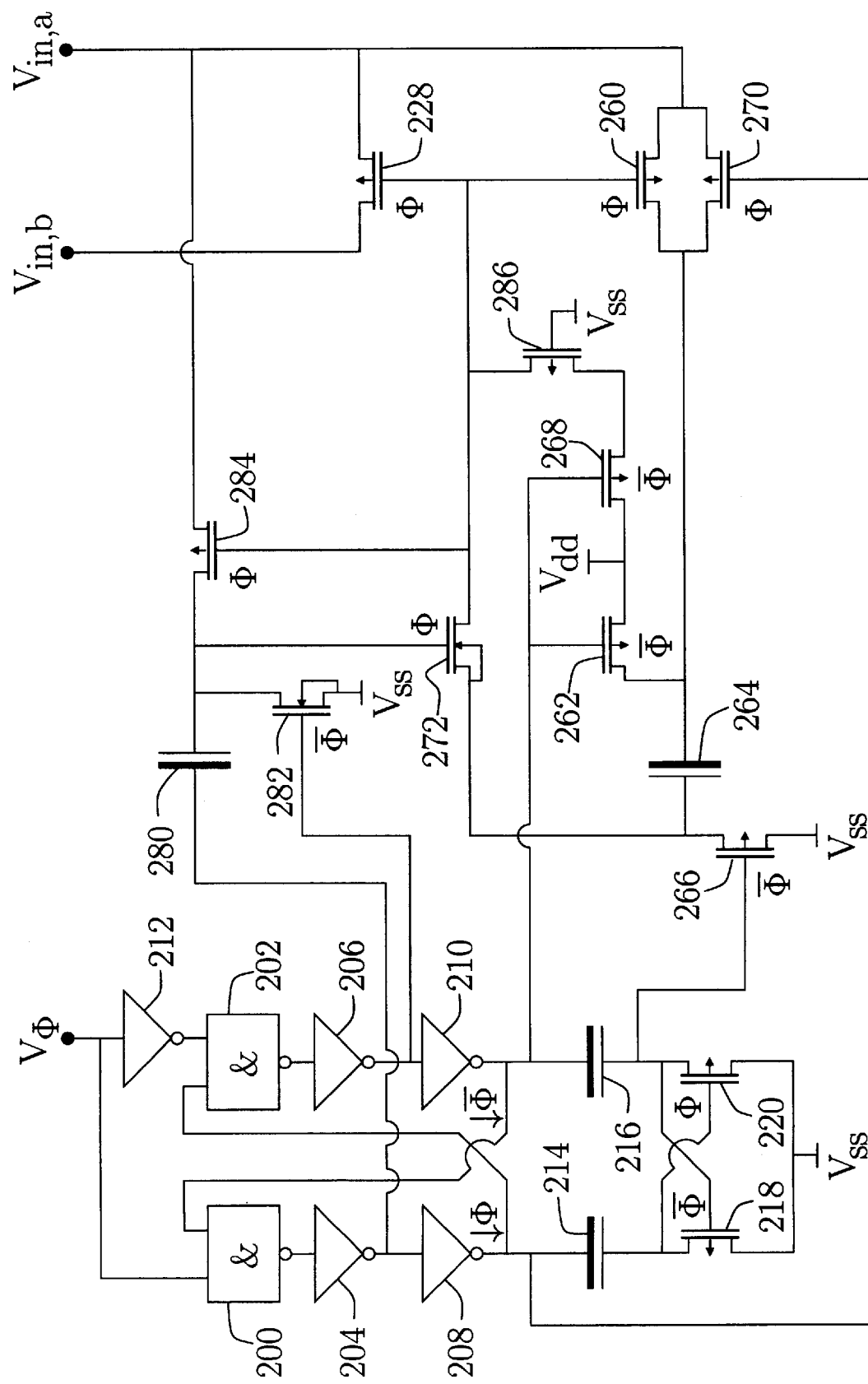

FIG. 5B: Shows an improved version of the analog-switch circuit shown in FIG. 5A. The maximum voltage applied across the gate oxide is now limited to the supply-voltage difference.

Figure 5C:
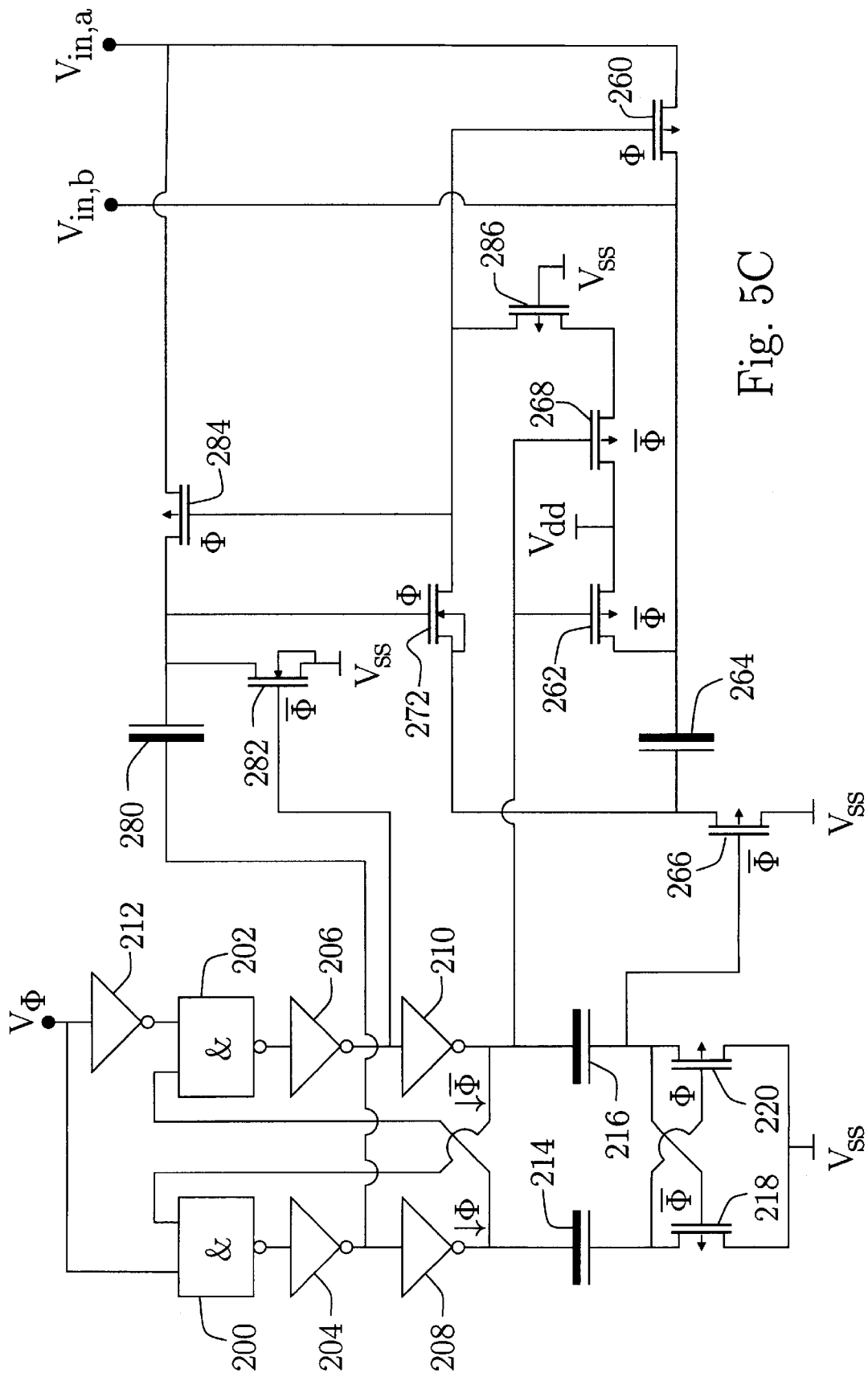

FIG. 5C: Shows an application-specific embodiment. It can, for example, be used as a clock-signal generator for constant-overdrive MOSFET-based analog switches.

Figure 6A:
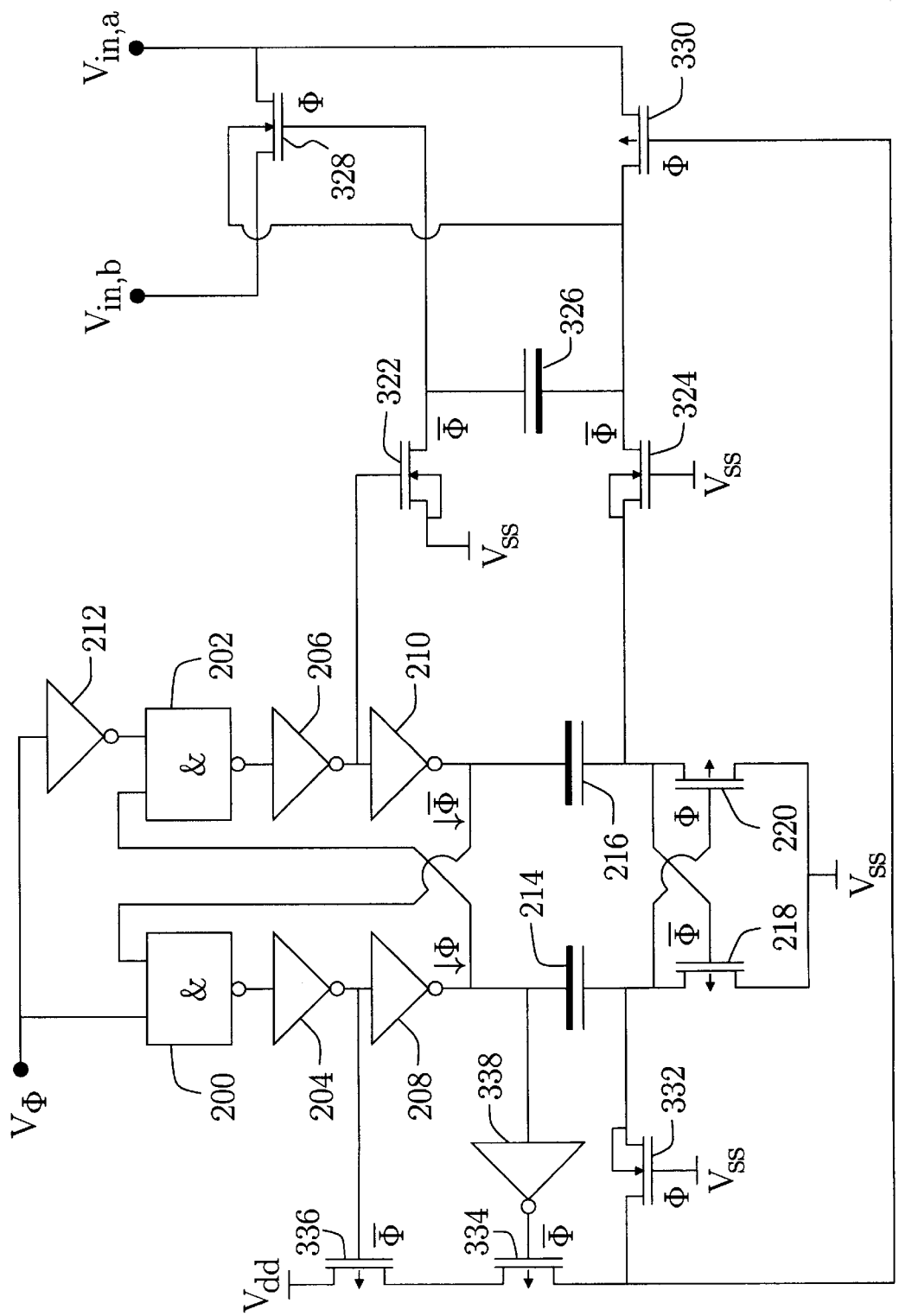

FIG. 6A: Shows an implementation of an analog-switch circuit, for which the main switch element can be compensated for the body effect, even when the circuit is implemented in a single-well technology.

Figure 6B:
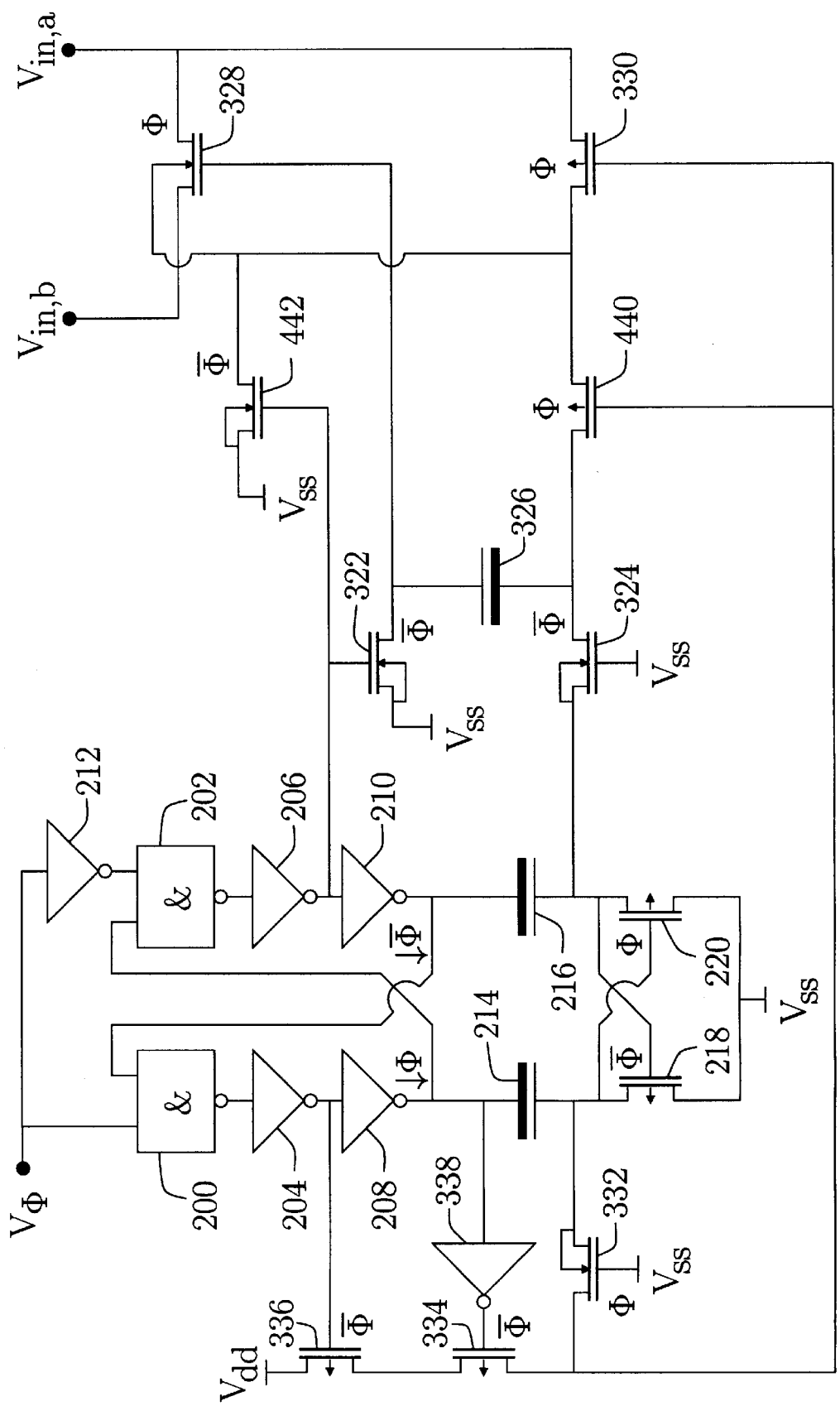

FIG. 6B: Shows an improved version of the analog-switch circuit shown in FIG. 6A.

Figure 6C:
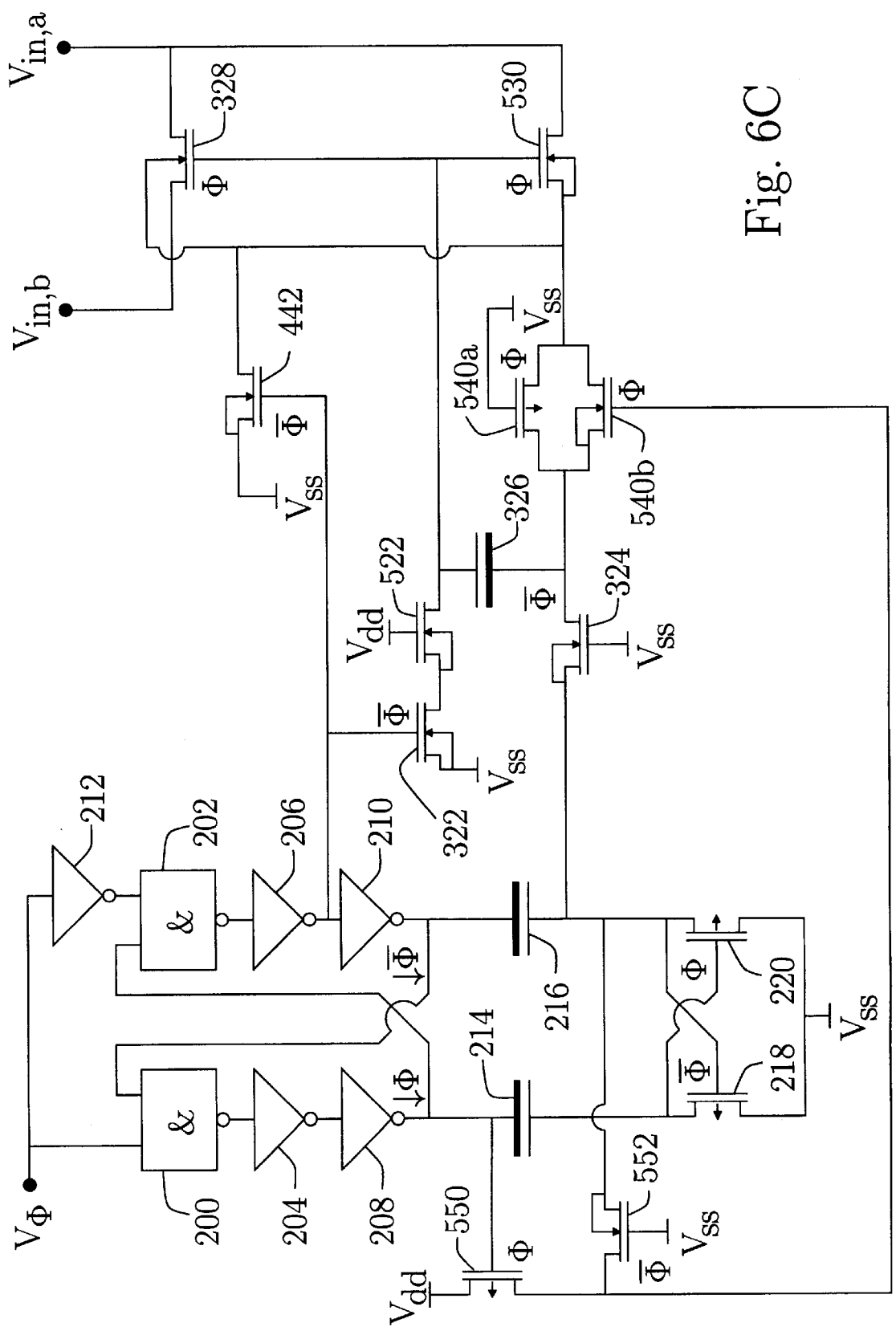

FIG. 6C: Shows a variant of the analog-switch circuit shown in FIG. 6B, for which the maximum voltage applied across the gate oxide is limited to the supply-voltage difference.

Figure 6D:
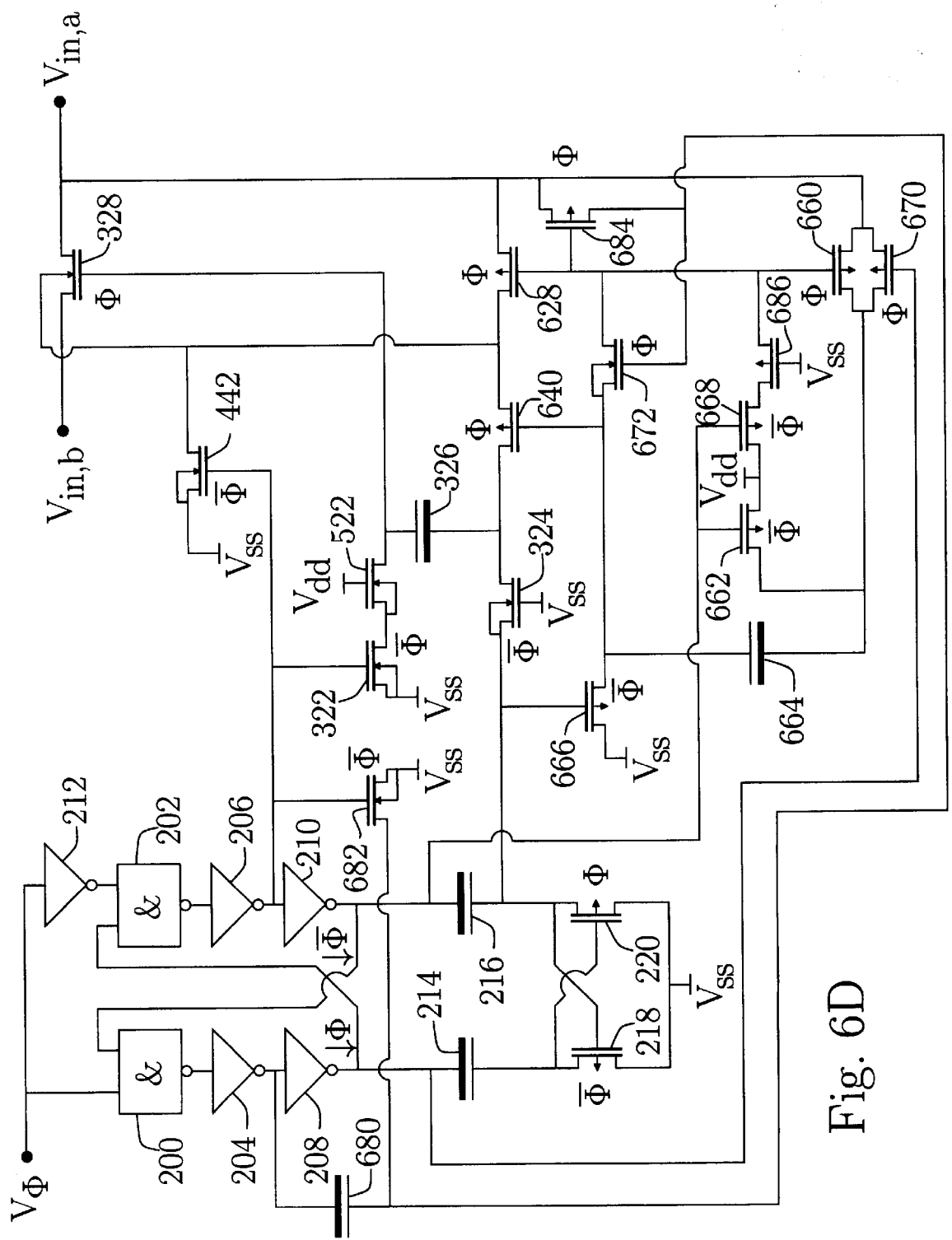

FIG. 6D: Shows an improved version of the analog-switch circuit shown in FIG. 6C. It protects the gate oxide and it can operate with a very low supply-voltage difference.

5 DESCRIPTION OF PREFERRED EMBODIMENTS

FIGS. 5A, 5B, 5C, 6A, 6B, 6C, and 6D shows some preferred embodiments. They are all designed for implementation in CMOS P-well technologies providing enhancement-mode MOSFETs. Thus, all P-channel MOSFETs (PMOS) have their "bulk terminal" connected to a common substrate. It is assumed that the common substrate is connected to the high supply potential $V_{dd}$.

MOSFETs are usually symmetrical with respect to their drain and source terminals. In the following description, the term "drain terminal" has randomly been assigned to one of the two terminals (the other being the "source terminal"). The distinction is made merely to provide clarity. Minor improvements may possibly be obtained by using asymmetrical MOSFETs.

For simplicity, it is assumed that the absolute value of the threshold voltage of a PMOS is approximately the same as the threshold voltage of a NMOS. In this patent application, the term "threshold voltage" refers to the absolute value, regardless of the polarity of the transistor to which it refers.

Capacitors are in theory symmetrical two-terminal components. However, in integrated circuits they are typically implemented as "poly-poly" capacitors or as MOSFETs coupled as capacitors, and hence one of the two terminals' capacitive coupling to ground will in general be larger than the other's. In the following description, the two capacitor terminals are referred to as the "top plate" and the "bottom plate." The top plate should preferably be the capacitor terminal having the least capacitive coupling to ground, but it does not necessarily have to be the physical upper plate (although that is the typical case). In the Figures, the top plate is shown with a thinner line than the bottom plate.

"Ground" is defined as the low supply potential $V_{ss}$. Thus, the voltage levels of a standard CMOS-logic port are represented by ground (logic low) and the supply-voltage difference $V_{sup}$ (logic high).

The symbols $\Phi$ and $\overline{\Phi}$, that in the Figures appear next to the MOSFETs, indicate whether the respective MOSFETs are intended to conduct in the analog-switch circuit's on-state ($\Phi$) or off-state ($\overline{\Phi}$).

5.1 Description: Common Clock-Generating Circuit

The Common Clock-Generating Circuit is used for all the embodiments to be described (it is shown in FIGS. 5A, 5B, 5C, 6A, 6B, 6C, and 6D). For simplicity, it will now be described separately. It is not the simplest possible implementation, but it has some advantages that are important in critical situations.

The control terminal (labeled $V_\Phi$) is connected to the input of an inverter [212] and to the first input terminal of a two-input NAND-gate [200]. The output from the NAND-gate [200] is connected to the input of an inverter [204]. The output of inverter [204] is connected to the input of an inverter [208]. The output from inverter [208] is connected to the bottom plate of a capacitor [214] and to the first input terminal of a two-input NAND-gate [202]. The second input terminal of NAND-gate [202] is connected to the output of inverter [212]. The output of NAND-gate [202] is connected to the input of an inverter [206]. The output of inverter [206] is connected to the input of an inverter [210]. The output of inverter [210] is connected to the second input terminal of NAND-gate [200] and to the bottom plate of a capacitor [216]. The top plate of capacitor [216] is connected to the gate terminal of a PMOS [218] and to the drain terminal of a PMOS [220]. The drain terminal of PMOS [218] is connected to the gate terminal of PMOS [220] and to the top plate of capacitor [214]. The source terminal of PMOS [218] is connected to the source terminal of PMOS [220] and to the low supply potential $V_{ss}$.

5.2 Operation: Common Clock-Generating Circuit

The five inverters [204] [206] [208] [210] [212] and the two NAND-gates [200] [202] generate a first clock signal ($\downarrow\Phi$), provided at the output of inverter [208], and a second clock signal ($\downarrow\overline{\Phi}$), provided at the output of inverter [210]. Similar circuits are frequently used as clock-phase generators for SC circuits, and hence the operation is well-known to those skilled in the art.

In the two steady-state conditions, the first clock signal ($\downarrow\Phi$) will have the opposite (inverted) logical value as that of the control signal applied to the control terminal ($V_{\Phi}$). The second clock signal ($\downarrow\overline{\Phi}$) will have the same logical value as the control signal. Hence, the steady-state function can be implemented by a single inverter. However, the described circuit also assures that the two clock signals are never low at the same time (even in the transitions between the steady-state conditions). The waveforms are shown in FIG. 4.

In the following description, the "on-state" refers to the condition where the first clock signal ($\downarrow\Phi$) is low, whereas the "off-state" is defined as when the second clock signal ($\downarrow\overline{\Phi}$) is low. There are short periods of time in the transitions between these conditions.

The two capacitors [214] [216] and the two PMOS transistors [218] [220] implement a level shifter. The purpose of the level shifter is to maintain the two capacitors [214] [216] charged to the supply-voltage difference $V_{sup}=V_{dd}-V_{ss}$, at all times. Hence, the two logic clock signals, ($\downarrow\Phi$) and ($\downarrow\overline{\Phi}$), are also present at the top plate of the capacitors [214] [216], but here they are represented by voltage levels that are the supply-voltage difference lower than the (same) clock signals defined on the bottom plates.

The level shifter operates as follows. Assume that both capacitors [214] [216] are nearly fully charged, i.e. that the potentials on the bottom plates are approximately the supply-voltage difference higher than the potentials on the respective top plates. In the transition from the off-state to the on-state, the output from the two inverters [208] [210] will be high. Hence, the gate terminals of PMOS [218] and PMOS [220] will both have potentials close to $V_{ss}$. These potentials are not low enough to turn on either of the two transistors [218] [220]. At the onset of the on-state, the output from inverter [208] changes from the high to low. The potential of the capacitor's [214] top plate is thereby shifted down to $V_{ss}-V_{sup}$, whereby PMOS [220] is turned on. Thus, capacitor [216] will be charged between $V_{dd}$ (output from inverter [210]) and $V_{ss}$ (via PMOS [220]). The transition to the off-state is similar: capacitor [216] turns on PMOS [218], and capacitor [214] will be charged. Assuming that the top plates of the capacitors [214] [216] are loaded by only small stray capacitors, they will at all times be charged to approximately the supply-voltage difference.

The advantage of generating non-overlapping clock signals, ($\downarrow\Phi$) and ($\downarrow\overline{\Phi}$), can now be observed. If the off-state is slightly overlapping the off-state, the following would happen in the transition from the off-state to the on-state. The output from inverter [208] would go low shortly before the output of inverter [210] goes high. Thus, PMOS [218] would remain conducting in a small fraction of the on-state when the output of inverter [208] is low, and hence capacitor [214] would be partially discharged. The degree of which the capacitor [214] would be discharged depends of several parameters including the aspect ratio of PMOS [218] and the duration of the overlap period. In any case, the effect is undesirable and can be avoided by employing the proposed non-overlapping clock signals.

5.3 Description: FIGS. 5A, 5B, and 5C

A first preferred embodiment is shown in FIG. 5A. An improvement is shown in FIG. 5B. FIG. 5C shows an application-specific embodiment.

5.3.1 Description: FIG. 5A

The circuit shown in FIG. 5A comprises the described Common Clock-Generating Circuit. In other words, the components [200] [202] [204] [206] [208] [210] [212] [214] [216] [218] [220] are included and connected as previously described.

The remaining part of the circuit is the actual switch. If two or more switches are to be implemented, only this portion of the circuit needs to be replicated.

A first switch terminal, labeled $V_{in,a}$, is connected to the drain terminal of a PMOS [228] (the main switch element), to the drain terminal of a PMOS [260], and to the drain terminal of a PMOS [270]. A second switch terminal, labeled $V_{in,b}$, is connected to the source terminal of PMOS [228]. The gate terminal of PMOS [270] is connected to the output of inverter [208]. The source terminal of PMOS [270] is connected to the source terminal of PMOS [260], to the bottom plate of a capacitor [264], and to the drain terminal of a PMOS [262]. The top plate of capacitor [264] is connected to the drain terminal of a PMOS transistor [266], to the source terminal of a NMOS [272], and to the bulk terminal (i.e. P-well in which the NMOS is implemented) of NMOS [272]. The drain terminal of NMOS [272] is connected to the gate terminal of PMOS [228], to the gate terminal of PMOS [260], and to the drain terminal of a PMOS [268]. The gate terminal of NMOS [272] is connected to the output of inverter [204]. The gate terminal of PMOS [266] is connected to the top plate of capacitor [216]. The source terminal of PMOS [266] is connected to the low supply potential $V_{ss}$. The gate terminal of PMOS [262] is connected to the gate terminal of PMOS [268] and to the output terminal of inverter [210]. The source terminal of PMOS [262] is connected to the source terminal of PMOS [268] and to the high supply potential $V_{dd}$.

5.3.2 Description: FIG. 5B

FIG. 5B shows a minor modification of the analog-switch circuit shown in FIG. 5A. The following description describes the steps required to transform the analog-switch circuit shown in FIG. 5A into the analog-switch circuit shown in FIG. 5B.

First disconnect the gate terminal of NMOS [272] from the output of inverter [204], and remove all interconnections connected to the drain terminal of PMOS [268].

Then implement the following. The gate terminal of NMOS [272] is connected to the drain terminal of a PMOS [284], to the drain terminal of a NMOS [282], and to the top plate of a capacitor [280]. The bottom plate of capacitor [280] is connected to the output of inverter [204]. The source terminal of NMOS [282] is connected to the bulk terminal of NMOS [282] and to the low supply potential $V_{ss}$. The gate terminal of NMOS [282] is connected to the output of inverter [206]. The source terminal of PMOS [284] is connected to the first input terminal $V_{in,a}$. The gate terminal of PMOS [284] is connected to the gate terminal of PMOS [228], to the gate terminal of PMOS [260], to the drain terminal of a PMOS [286], and to the drain terminal of NMOS [272]. The gate terminal of PMOS [286] is connected to the low supply potential $V_{ss}$. The source terminal of PMOS [286] is connected to the drain terminal of PMOS [268].

5.3.3 Description: FIG. 5C

FIG. 5C shows a minor modification of the analog-switch circuit shown in FIG. 5B. The steps required to transform the analog-switch circuit shown in FIG. 5B into the analog switching circuit shown in FIG. 5C are as follows. Remove PMOS [228] and PMOS [270] from the circuit. Connect the second input terminal $V_{in,b}$ to the source of PMOS [260].

5.4 Operation: FIGS. 5A, 5B, and 5C

A common feature of these switches is that the bootstrap capacitor [264] is maintained charged to the supply-voltage difference. In other words, the capacitor [264] operates as a floating battery providing a voltage approximately equal to the supply-voltage difference. Any element that can perform this function may replace capacitor [264] (even a battery).

5.4.1 Operation: FIG. 5A

Assume that capacitor [264] is charged to the supply-voltage difference $V_{sup}$, such that the bottom plate has the highest potential.

The on-state: The first input terminal $V_{in,a}$ is connected to the bottom plate of capacitor [264] via PMOS transistor [260]. The top plate of capacitor [264] is connected to the gate terminal of PMOS [228] (the main switch element) via NMOS [272]. This assures that the gate voltage of PMOS [228] will equal the voltage applied to its drain terminal (i.e. the first input terminal, $V_{in,a}$) less the supply-voltage difference. Hence, PMOS [228] will provide a current path between the two switch terminals $V_{in,a}$ and $V_{in,b}$, which has a nearly signal-independent conductance. The body effect may cause the conductance to be slightly signal-dependent.

The off-state: The transistors [260] [270] [272] are turned off. The bootstrap capacitor [264] is connected to the high supply potential $V_{dd}$ via PMOS [266] and to the low supply potential $V_{ss}$ via PMOS [262]. Thus, the capacitor [264] is charged to the supply-voltage difference, and hence the initial assumption is justified. PMOS [268] connects the gate terminal of PMOS [228] to the high supply potential $V_{dd}$. This efficiently inhibits current from flowing between the two switch terminals, $V_{in,a}$ and $V_{in,b}$.

The following will discuss some details that are important when implementing this analog-switch circuit.

Although the switching operation of PMOS [268] is straightforward, notice that the voltage applied across its gate oxide will be up to twice the supply-voltage difference. This is assumed to be acceptable in this embodiment, but it may not be acceptable for all combinations of technologies and supply voltages. It will now be described what causes the large voltage. In the on-state, when PMOS [268] is off, the drain terminal of PMOS [268] is applied a potential that may be as low as minus the supply-voltage difference (dependent on the input signal applied to the first switch terminal $V_{in,a}$). The gate terminal of PMOS [268] is applied a logic-high signal ($V_{dd}$) from inverter [210]. Thus, twice the supply-voltage difference may appear across the gate oxide.

The P-channel polarity of the transistors PMOS [266] [268] is chosen to assure that their PN-junctions connected to the substrate will be reverse-biased as required. This choice, however, implies that a negative gate voltage is required to turn PMOS [266] on. The level shifter (capacitors [214] [216] and PMOS [218] [220]) is used to generate the required negative clock signal. PMOS [266] can be a small transistor, and hence the implementation of the level shifter requires only a small chip area.

Note that the internal switches that conduct in the off-state (PMOS [262] [266] [268]), are turned off as the off-state ends, as opposed to when the on-state starts. Hence, capacitor [264] is floating in the transition period, which is preferable to prevent it from being discharged.

When the on-state begins, the signal on the gate of NMOS [272] raises from the low to the high supply potential. Thus, NMOS [272] will conduct and connect the top plate of capacitor [264] to the gate terminal of PMOS [228]. To avoid the necessity of complex circuits to generate a very low gate voltage, this switch (NMOS [272]) must be an NMOS. To avoid forward-biasing of PN junctions connected to the substrate, this NMOS [272] must be implemented in a P-well biased at a sufficiently low voltage. The required bias can be obtained using a charge pump or simply by connecting the P-well to the top plate of capacitor [264] (as shown in FIG. 5A). The voltage applied across the gate oxide of NMOS [272] will be as large as twice the supply-voltage difference. This is assumed to be acceptable in this embodiment.

PMOS [260] represents an important novelty of this analog-switch circuit. When the supply-voltage difference is very small, traditional implementations cannot reliably connect the first input terminal $V_{in,a}$ to the bottom plate of capacitor [264]. In this embodiment, PMOS [260] (which maintains this function) has its gate terminal connected to the gate terminal of the main switch element, PMOS [228]. Thus, PMOS [260] will in the on-state operate with constant overdrive and, therefore, provide a very reliable connection. The operation is as follows. Assume that NMOS [272] conducts in the on-state as intended. The feedback loop—from the source terminal of PMOS [260] via the constantly-charged capacitor [264], NMOS [272], and back to the gate terminal of PMOS [260]—will lock and assure a constant overdrive of PMOS [260]. Hence, PMOS [260] will conduct very well. Since the gate and drain terminals of PMOS [260] and PMOS [228] are connected, PMOS [228] (the main switch element) will also operate with a constant overdrive. Hence, in the on-state, this analog-switch circuit will provide a nearly-constant conductance between the two switch terminals, $V_{in,a}$ and $V_{in,b}$. However, if NMOS [272] fails to conduct, the feedback loop will not be established, and the on-state of analog-switch circuit will fail. NMOS [272] will conduct only if the potential of the top plate of capacitor [264] is lower than the high supply potential $V_{dd}$ less the threshold voltage. Initially this may seem to always be the case, but a problem may arise because capacitor [264] is floating in the transition from the off-state to the on-state. Stray capacitance will in general prevent the potential of capacitor [284] from drifting too far, but if the supply-voltage difference is only marginally higher than the threshold voltage, the operation of the analog-switch circuit can potentially fail. Reliable operation can be assured in many ways; a simple method is to include the optional PMOS [270].

5.4.2 Operation: FIG. 5B

The analog-switch circuit shown in FIG. 5B is a variation of the analog-switch circuit shown in FIG. 5A. The changes are incorporated to prevent the voltages occurring across the gate oxide from exceeding the supply-voltage difference. In the analog-switch circuit shown in FIG. 5A, PMOS [268] and NMOS [272] do not fulfill this criteria.

The gate oxide of PMOS [268] is simple to protect; a cascode transistor PMOS [286] is sufficient. In the off-state, the gate terminal of the two PMOS transistors [268] [286] are connected to ground. Hence, they are both turned on. In the on-state, PMOS [268] is turned off, and hence the state of PMOS [286] is irrelevant. The gate oxides of both transistors [268] [286] are well-protected, because the voltage between the top plate of capacitor [264] and the gate terminal of PMOS [268] is spread over two devices.

It is not as simple to protect the gate oxide of NMOS [272]. The difficulty is that the gate voltage of NMOS [272] needs to be signal-dependent. In this embodiment, the required protection is implemented by switching the gate terminal of NMOS [272] between ground and the first input terminal $V_{in,a}$. The off-state is straightforward, NMOS [282] connects the gate terminal of NMOS [272] to ground. In the on-state, the gate terminal of NMOS [272] is connected to the first switch terminal $V_{in,a}$ via PMOS [284], which supposedly will conduct with a constant overdrive. Unfortunately, the analog-switch circuit has a potential startup problem, which can be avoided by including capacitor [280]. The potential startup problem will now be explained. NMOS [272] must conduct to turn on PMOS [260], which then will lower the common potential of the gate terminals of PMOS [228] [260] [284], which then will turn on PMOS [284]. The problem is that NMOS [272] will not turn on before PMOS [284] is turned on, and hence the loop will not lock because the switches are waiting for each other to turn on. However, a simple charge pulse is sufficient to get the loop started and make it lock. The capacitor [280] is discharged in the off-state, and it will provide the required charge pulse when the output of inverter [204] raises in the transition from the off-state to the on-state. Once the loop is turned on, PMOS [284] will regulate the potential of the gate terminal of NMOS [272], which efficiently will protect the gate oxide of NMOS [272] while preserving the analog-switch circuit's function.

5.4.3 Operation: FIG. 5C

FIG. 5C shows a somewhat untraditional embodiment. It is an analog switching circuit that can switch the second switch terminal $V_{in,b}$ between a voltage signal applied to the first switch terminal $V_{in,a}$ and the high supply potential $V_{dd}$. Examples of systems that may utilize such a switching function include switched-capacitor circuits. Also, as exemplified in an embodiment to be discussed, the circuit can be used to generate the control (gate) signal for constant-overdrive MOSFET-based analog switches.

The principle is as follows. From the previously discussed embodiments (FIGS. 5A and 5B), it can be observed that the bottom plate of capacitor [264] is switched between the first input terminal $V_{in,a}$ and the high supply potential $V_{dd}$. If a circuit requires this specific function, there is no need to implement PMOS [228] and the otherwise-required switch to connect the second switch terminal $V_{in,b}$ to the high supply potential $V_{dd}$. It is simpler to connect the second switch terminal $V_{in,b}$ as shown in FIG. 5C.

PMOS [270] has been removed from the circuit to assure that the conductance between the two switch terminals, $V_{in,a}$ and $V_{in,b}$, will be signal-independent. If the impedance of the external circuit, to which the second switch terminal $V_{in,b}$ is connected, is just reasonably low, the analog-switch circuit will not have a startup problem. If this cannot be assured, a small capacitor (not shown), connected between the output of inverter [208] and the bottom plate of capacitor [264], can be used as an alternative to PMOS [270].

5.5 Description: FIGS. 6A and 6B

FIG. 6A shows the most basic version of a preferred embodiment. FIG. 6B shows a simple improvement that will make the switch circuit more useful in practice.

5.5.1 Description: FIG. 6A

The analog-switch circuit shown in FIG. 6A comprises the Common Clock-Generating Circuit. In other words, the components [200] [202] [204] [206] [208] [210] [212] [214] [216] [218] [220] are included and connected as previously described.

The rest of the analog-switch circuit is realized as follows. The gate terminal of a PMOS [336] is connected to the output of inverter [204]. The source terminal of PMOS [336] is connected to the high supply potential $V_{dd}$. The drain terminal of PMOS [336] is connected to the source terminal of a PMOS [334]. The gate terminal of PMOS [334] is connected to the output of an inverter [338]. The input of inverter [338] is connected to the output of inverter [208]. The drain terminal of PMOS [334] is connected to the drain terminal of a NMOS [332] and to the gate terminal of a PMOS [330]. The gate terminal of NMOS [332] is connected to the low supply potential $V_{ss}$. The bulk terminal of NMOS [332] is connected to the source terminal of NMOS [332] and to the top plate of capacitor [214]. A first switch terminal (labeled $V_{in,a}$) is connected to the drain terminal of a NMOS [328] (the main switch element) and to the drain terminal of PMOS [330]. A second switch terminal (labeled $V_{in,b}$) is connected to the source terminal of NMOS [328]. The source terminal of PMOS [330] is connected to the bulk terminal of NMOS [328], to the drain terminal of a NMOS [324], and to the bottom plate of a capacitor [326]. The gate terminal of NMOS [324] is connected to the low supply potential $V_{ss}$. The source terminal of NMOS [324] is connected to the bulk terminal of NMOS [324] and to the top plate of capacitor [216]. The top plate of capacitor [326] is connected to the drain terminal of a NMOS [322] and to the gate terminal of NMOS [328]. The gate terminal of NMOS [322] is connected to the output of inverter [206]. The source terminal of NMOS [322] is connected to the bulk terminal of NMOS [322] and to the low supply potential $V_{ss}$.

5.5.2 Description: FIG. 6B

FIG. 6B shows a minor modification of the analog-switch circuit shown in FIG. 6A. The main difference is the way that the bulk terminal of NMOS [328] is biased. The following will describe the steps required to transform the analog-switch circuit shown in FIG. 6A into the analog-switch circuit shown in FIG. 6B.

Remove all interconnections connected to the bulk terminal of NMOS [328]. Connect the bottom plate of capacitor [326] to the drain terminal of NMOS [324] and to the drain terminal of a PMOS [440]. Connect the gate terminal of PMOS [440] to the gate terminal of PMOS [330]. Connect the source terminal of PMOS [440] to the bulk terminal of NMOS [328], to the source terminal of PMOS [330], and to the drain terminal of a NMOS [442]. Connect the gate terminal of NMOS [442] to the output of inverter [206]. Connect the source terminal of NMOS [442] to the bulk terminal of NMOS [442] and to the low supply potential $V_{ss}$.

5.6 Operation: FIGS. 6A and 6B

As discussed in the description of FIG. 5A, the embodiments described thus far cannot be compensated for the body effect when implemented in a single-well technology. This is because the polarity of the MOSFET performing the operation of NMOS [272] needs to be of the opposite polarity as of the main switch element, PMOS [228]. Since a separate well is required for NMOS [272], PMOS [228] cannot be compensated for the body effect in a single-well technology.

The following 4 preferred embodiments, of which FIGS. 6A and 6B show the first two, avoid this problem, i.e. they can be compensated for the body effect, even when implemented in a single-well technology. The key technique is to charge the bootstrap capacitor between ground and minus the supply voltage, as opposed to between the high and the low supply potential. When using this technique, the function performed by NMOS [272] is no longer needed. Hence, a body-effect-compensated constant-overdrive analog-switch circuit can be implemented.

5.6.1 Operation: FIG. 6A

This is a very simple embodiment using only 3 internal switches. Assume that capacitor [326] is charged to the supply-voltage difference $V_{sup}$, with the top plate having the highest potential.

The on-state: The bottom plate of the bootstrap capacitor [326] and the bulk terminal of NMOS [328] (the main switch element) is via PMOS [330] connected to the first switch terminal $V_{in,a}$. The top plate of capacitor [326] is connected directly to the gate terminal of NMOS [328].

Hence, the main switch element's gate-to-channel and the bulk-to-channel voltages are approximately constant and signal-independent, i.e. the analog-switch circuit will provide a constant-conductance connection between the two switch terminals, $V_{in,a}$ and $V_{in,b}$.

The off-state: NMOS [322] connects the gate terminal of NMOS [328] to the low supply potential. This assures that NMOS [328] insulates the two switch terminals, $V_{in,a}$ and $V_{in,b}$.

Capacitor [326] is charged to the supply-voltage difference. NMOS [322] connects the top plate of capacitor [326] to ground, whereas NMOS [334] connects the bottom plate of capacitor [326] to the top plate of capacitor [216], which in the off-state provides a potential that is approximately the supply-voltage difference below ground.

Generation of a negative voltage to charge the bootstrap capacitor [326] is a main issue in the design of this type of analog-switch circuit. The required voltage can of course be supplied externally, but that is rarely an option. Observe instead that once the bootstrap capacitor [326] is fully charged, only stray capacitors will be charged and discharged in each cycle. In other words, the voltage source needed to charge the bootstrap capacitor [326] may have a high output impedance. Hence, a simple on-chip charge pump can be used for this purpose. A charge pump can be based on the Common Clock-Generating Circuit (elements [200] [202] [204] [206] [208] [210] [212] [214] [216] [218] [220]) and a couple of NMOS transistors used to rectify the signals generated at the top plate of capacitors [214] and [216]. In this case, however, an even simpler option exists. The negative voltage is needed only in the off-state, and then it will be available at the top plate of capacitor [216] (i.e. rectification is not needed).

NMOS [324] performs the switching function of connecting and disconnecting the two capacitors [216] [326]. Notice that the switch, NMOS [324], is controlled from its source terminal (by capacitor [216]) rather than from its grounded gate terminal. Since the source terminal of NMOS [324] in the off-state will have a potential approximately the supply-voltage difference below the low supply potential $V_{ss}$, NMOS [324] must be implemented in a well biased at a sufficiently low potential. The simplest way to bias the well is to connect it to the top plate of capacitor [216], as shown in FIG. 6A. Because NMOS [324] can be made very small, this biasing technique is often acceptable, although it does cause more stray-capacitance load of capacitor [216] than strictly necessary. A more sophisticated solution would bias the bulk terminal of NMOS [324] to minus the supply voltage by means of a charge pump. The implementation of a charge pump requires only two extra NMOS transistors when it is based on the Common Clock-Generating Circuit. Also, one biased well can be shared by multiple analog-switch circuits.

The operation of NMOS [322] is straightforward. Notice that, in the on-state when NMOS [322] is turned off, a voltage of up to twice the supply-voltage difference may occur across the gate oxide. This is, however, assumed to be acceptable in this embodiment.

The switching operation performed by PMOS [330] is as usual critical. Inspired by the embodiments discussed above, it may seem appropriate to use an NMOS with its gate terminal connected the gate terminal of NMOS [328]. This is unfortunately not possible, because the bottom plate of capacitor [326] has a negative potential in the off-state, and hence a NMOS implementation of the switch (PMOS [330]) would be difficult to turn off. Hence, the switch is implemented by PMOS [330], which in this simple embodiment is controlled by a doubled clock signal to assure the analog-switch circuit's on-state. The doubled clock signal (plus and minus the supply voltage) is generated by the Common Clock-Generating Circuit (elements [200] [202] [204] [206] [208] [210] [212] [214] [216] [218] [220]), the two PMOS transistors [334] [336], the inverter [338], and the NMOS [332]. The operation of this circuit is as follows. In a period of time, which starts a digital-gate delay after the on-state ends and ends a digital-gate delay before the next on-state begins, the gate terminal of PMOS [330] is connected to the high supply potential $V_{dd}$ via PMOS [334] and PMOS [336]. PMOS [330] is thereby turned off. In the on-state, the gate terminal of PMOS [330] is via NMOS [332] connected to the top plate of capacitor [214], which in the on-state has a potential of about minus the supply-voltage difference. The thereby provided negative potential will efficiently turn PMOS [330] on. The voltage applied across the gate oxide of PMOS [330] may be up to twice the supply-voltage difference, which is assumed to be acceptable in this embodiment.

5.6.2 Operation: FIG. 6B

NMOS [328] can be a fairly large transistor, and hence the stray capacitance of the bulk terminal may represent a considerable load. FIG. 6B shows a variation of the analog-switch circuit shown in FIG. 6A, in which capacitor [216] is not loaded by the bulk terminal of NMOS [328]. The switching function performed by PMOS [330] is now performed by the series connection of PMOS [330] and PMOS [440]. By connecting the bulk terminal of NMOS [328] to the common node of PMOS [330] and PMOS [440], it will not be driven to minus the supply-voltage difference in each off-state, and hence capacitor [216] will see a smaller capacitive load. Although not always needed, NMOS [442] is included to bias the bulk terminal of NMOS [328] to the low supply potential $V_{ss}$ in the off-state.

The switch circuit shown in FIG. 6B represents an only minor modification of the switch circuit shown in FIG. 6A, but it may significantly reduce the chip area required to implement capacitor [216]. Hence, although realized differently, the following two preferred embodiments will also include these extra internal switches.

5.7 Description: FIG. 6C

The switch circuits shown in FIGS. 6A and 6B uses doubled clock signals to control PMOS [330] and PMOS [440]. The gate oxide of these transistors is thereby applied voltages higher than the supply-voltage difference. The gate oxide of NMOS [322] is also stressed above this level. FIG. 6C shows a variant of the analog-switch circuit, which is not subject to this problem.

The key modification, with respect to FIG. 6B, is that the internal switches realized by PMOS transistors [330] and [440] are replaced by other realizations. The gate oxide of NMOS [332] is protected by a cascode-coupled NMOS. For clarity, the analog-switch circuit is described from scratch.

The analog-switch circuit shown in FIG. 6C comprises the Common Clock-Generating Circuit. In other words, the components [200] [202] [204] [206] [208] [210] [212] [214] [216] [218] [220] are included and connected as previously described. The remaining part of the analog-switch circuit is realized as follows. The gate terminal of a PMOS [550] is connected to the output of inverter [208]. The drain terminal of PMOS [550] is connected to the high supply potential $V_{dd}$. The source terminal of PMOS [550] is connected to the drain terminal of a NMOS [552] and to the gate terminal of a NMOS [540b]. The gate terminal of NMOS [552] is connected to the low supply potential $V_{ss}$. The source terminal of NMOS [552] is connected to the bulk terminal of NMOS [552], to the top plate of capacitor [216], to the source terminal of NMOS [324], and to the bulk terminal of NMOS [324]. A first switch terminal (labeled $V_{in,a}$) is connected to the drain terminal of a NMOS [328] (the main switch element) and to the drain terminal of a NMOS [530]. A second switch terminal (labeled $V_{in,b}$) is connected to the source terminal of NMOS [328]. The bulk terminal of NMOS [328] is connected to the source terminal of NMOS [530], to the bulk terminal of NMOS [530], to the drain terminal of PMOS [540a], to the drain terminal of NMOS [540b], and to the drain terminal of NMOS [442]. The gate terminal of NMOS [442] is connected to the gate terminal of NMOS [322] and to the output terminal of inverter [206]. The source terminal of NMOS [442] is connected to the bulk terminal of NMOS [442] and to the low supply potential $V_{ss}$. The source terminal of PMOS [540a] is connected to the source terminal of NMOS [540b], to the bulk terminal of NMOS [540b], to the bottom plate of a capacitor [326], and to the drain terminal of NMOS [324]. The gate terminal of PMOS [540a] is connected to the low supply potential $V_{ss}$. The gate terminal of NMOS [324] is connected to the low supply potential $V_{ss}$. The top plate of capacitor [326] is connected to the gate terminal of NMOS [328], to the drain terminal of a NMOS [522], and to the gate terminal of NMOS [530]. The gate terminal of NMOS [522] is connected to the high supply potential $V_{dd}$. The source terminal of NMOS [522] is connected to the bulk terminal of NMOS [522] and to the drain terminal of NMOS [322]. The source terminal of NMOS [322] is connected to the bulk terminal of NMOS [322] and to the low supply potential $V_{ss}$.

5.8 Operation: FIG. 6C

FIG. 6C shows a variation of the analog-switch circuit, for which the maximum voltage applied across the gate oxide is limited to the supply-voltage difference. The analog-switch circuit relies on the operation of a CMOS "transmission gate" (PMOS [540a] and NMOS [540b]), and hence it is not designed for ultra-low-voltage applications.

The gate oxide of NMOS [322] is simple to protect. Cascode transistor NMOS [522] performs this function. Its operation is similar to the discussed operation of PMOS [286] in FIG. 5B. An alternative method would be to remove NMOS [322] and connect the gate terminal of NMOS [522] to the high supply potential $V_{dd}$, connect the drain terminal of NMOS [522] to the top plate of capacitor [326], and connect the source terminal of NMOS [522] to the output of inverter [210]. Although operating at a higher potential, the operation of this configuration of NMOS [522] would be similar to the operation of NMOS [324].

The main difference lies in the slightly untraditional CMOS transmission gate consisting of PMOS [540a] and NMOS [540b]. In the on-state, the gate terminals are connected to the supply rails as in a traditional CMOS transmission gate. This will not cause large voltages across the gate oxide. In the off-state, PMOS [540a] is turned off by lowering the channel potential via NMOS [324] [442]. NMOS [540b] needs a negative gate potential to become non-conductive. PMOS [550] and NMOS [552] generate the required control signal (plus and minus the supply-voltage difference). In the off-state, the drain and source terminals of NMOS [540b] are applied ground and minus the supply-voltage difference, respectively. Hence, the gate-oxide voltage of NMOS [540b] will not exceed the supply voltage difference.

NMOS-transistor [530] operates as a constant-overdrive switch with its gate terminal connected to the gate terminal of NMOS [328]. A standard CMOS transmission gate can be used instead. This switch, NMOS [530], does not have the previously discussed startup problem (in comparison with PMOS [260] in FIG. 5B). The reason is simply that the transmission gate will conduct at all potentials (assuming a sufficiently high supply-voltage difference), and hence the feedback loop cannot fail.

5.9 Description: FIG. 6D

While the switch shown in FIG. 6C protects the gate oxide, it cannot operate with the lowest supply-voltage differences of interest. FIG. 6D shows an analog-switch circuit that can operate with a supply-voltage difference which is only slightly larger than the threshold voltage. The switch circuit features gate-oxide protection, constant-overdrive on-state operation, and body-effect compensation.

The main difference, with respect to FIG. 6C, is that the internal switches realized by MOSFETs [530] [540a] [540b] are replaced by switches based on the analog-switch circuit shown in FIG. 5B. For clarity, the analog-switch circuit is described from scratch.

The analog-switch circuit shown in FIG. 6D comprises the Common Clock-Generating Circuit. In other words, the components [200] [202] [204] [206] [208] [210] [212] [214] [216] [218] [220] are included and connected as previously described.

A first switch terminal (labeled $V_{in,a}$) is connected to the drain terminal of NMOS [328] (the main switch element), to the drain terminal of a PMOS [628], to the drain terminal of a PMOS [660], to the drain terminal of a PMOS [670], and to the source terminal of a PMOS [684]. A second switch terminal (labeled $V_{in,b}$) is connected to the source terminal of NMOS [328]. The bulk terminal of NMOS [328] is connected to the source terminal of PMOS [628], to the drain terminal of a PMOS [640], and to the drain terminal of NMOS [442]. The gate terminal of NMOS [328] is connected to the top plate of capacitor [326] and to the drain terminal of NMOS [522]. The gate terminal of NMOS [522] is connected to the high supply potential $V_{dd}$. The source terminal of NMOS [522] is connected to the bulk terminal of NMOS [522] and to the drain terminal of NMOS [322]. The source terminal of NMOS [322] is connected to the bulk terminal of NMOS [322] and to the low supply potential $V_{ss}$. The gate terminal of NMOS [322] is connected to the gate terminal of NMOS [442], to the gate terminal of a NMOS [682], and to the output of inverter [206]. The source terminal of NMOS [442] is connected to the bulk terminal of NMOS [442] and to the low supply potential $V_{ss}$. The source terminal of NMOS [682] is connected to the bulk terminal of NMOS [682] and to the low supply potential $V_{ss}$. The bottom plate of capacitor [326] is connected to the source terminal of PMOS [640] and to the drain terminal of NMOS [324]. The gate terminal of NMOS [324] is connected to the low supply potential $V_{ss}$. The source terminal of NMOS [324] is connected to the bulk terminal of NMOS [324], to the gate terminal of a PMOS [666], and to the top plate of capacitor [216]. The source terminal of PMOS [666] is connected to the low supply potential $V_{ss}$. The drain terminal of PMOS [666] is connected to the top plate of a capacitor [664], to the gate terminal of PMOS [640], to the source terminal of a NMOS [672], and to the bulk terminal of NMOS [672]. The drain terminal of NMOS [672] is connected to the gate terminal of PMOS [628], to the gate terminal of PMOS [684], to the gate terminal of PMOS [660], and to the drain terminal of a PMOS [686]. The gate terminal of NMOS [672] is connected to the drain terminal of PMOS [684], to the top plate of a capacitor [680], and to the drain terminal of NMOS [682]. The bottom plate of capacitor [680] is connected to the output of inverter [204]. The bottom plate of capacitor [664] is connected to the drain terminal of a PMOS [662], to the source terminal of PMOS [660], and to the source terminal of PMOS [670]. The gate terminal of PMOS [670] is connected to the output terminal of inverter [208]. The gate terminal of a PMOS [668] is connected to the gate terminal of PMOS [662] and to the output of inverter [210]. The source terminal of PMOS [668] is connected to the source terminal of PMOS [662] and to the high supply potential $V_{dd}$. The drain terminal of PMOS [668] is connected to the source terminal of PMOS [686]. The gate terminal of PMOS [686] is connected to the low supply potential $V_{ss}$.

5.10 Operation: FIG. 6D

The topology of this analog-switch circuit should be familiar as it is merely a merged version of the analog-switch circuits shown in FIGS. 5B and 6C. The circuit elements with reference numerals that do not start with the digit 6 are the same as those shown in FIG. 6C. PMOS [628] and PMOS [640] implement the two switches, which in FIG. 6C are implemented by MOSFETs [530] and [540a] [540b], respectively. The circuit elements with reference numerals starting with the digit 6 are equivalent to the corresponding elements in FIG. 5B with reference numerals 400 less. Hence, PMOS [628] will in the on-state operate with constant overdrive, and the gate oxide of all MOSFETs will be applied voltages equal to or less than the supply-voltage difference.

PMOS [640] is the only truly new element. The analog-switch circuit would work if the gate terminal of PMOS [640] was connected to the gate terminal of PMOS [628]. However, in the off-state, PMOS [640] would have the high supply potential $V_{dd}$ applied to its gate terminal, while the source terminal is applied a potential of minus the supply-voltage difference. Thus, the gate oxide would be applied a voltage of twice the supply-voltage difference, which is considered unacceptable in this embodiment. Instead, the gate terminal of PMOS [640] is connected directly to the top plate of capacitor [664]. In the off-state, the gate terminal of PMOS [640] is connected to the low supply potential $V_{ss}$, leaving only the supply-voltage difference across the gate oxide. In the on-state, PMOS [640] and PMOS [628] will be applied the same gate-terminal signal, i.e. they will both conduct with a constant overdrive. Hence, the analog-switch circuit fulfills the given requirements, and it will provide a very reliable and high-performance switching function.

6 CONCLUSION, RAMIFICATIONS, AND SCOPE OF THE INVENTION

This invention provides high-performance analog switches that can be used for low-voltage applications. The switches are compensated for the dominating nonidealities that typically will degrade an analog-switch circuit's performance when the supply-voltage difference is low. Such nonidealities include Malfunction; the analog switch is not able to conduct a voltage signal which is in the rail-to-rail range.

Nonlinearity; the conductance of the analog switch is signal-dependent due to the body effect and/or a signal-dependent overdrive. This effect can cause significant signal distortion.

Breakdown of the gate oxide. As the technologies are scaled down, the gate oxide becomes increasingly sensitive. As of today, several technologies already specify a gate-oxide-breakdown voltage lower than twice the maximum supply-voltage difference. This ratio will supposedly continue to decrease, and it will become increasingly important and difficult to protect the gate oxide from large electrical fields.

FIG. 6D shows a generic switch that is compensated for all the nonidealities listed above. Although the invention has been taught in the reverse order, it is to be understood that this switch can be simplified to compensate for only those nonidealities that are of concern in a given design. In simple cases, a few MOSFETs and a bootstrap capacitor may be all what is required to implement each switch. The Common Clock-Generating Circuit, and other circuitry that generates signal-independent clock signals, need only be implemented once.

The described embodiments are all based on a MOSFET as the main switch element. In general, any insulated-gate semiconductor (i.e. any charge valve that can be controlled by one or more high-impedance terminals) may be used as the main switch element.

The described embodiments are intended for implementation in a P-well CMOS technology. However, it is to be understood that the switches can be implemented in N-well technologies as well. More sophisticated technologies, including dual-well and SOI technologies, can be used and will often yield even better results, but the production cost will typically be higher. The invention is not limited to implementations on silicon substrates. Several other types of semiconductors, for example Gallium-Arsenide, can be used instead.

Many variations of the described embodiments are possible. One of the (perhaps less obvious) options is to use a charge pump to bias the entire substrate at a potential beyond the supply rails. This will facilitate a N-well implementation of the embodiment shown in FIG. 5B, and hence the main switch element can be compensated for the body effect. Another option, which is also quite interesting, is to implement two complementary bootstrapped switches and operate them in parallel. The advantage being that the analog-switch circuit's sensitivity to stray capacitance thereby is significantly reduced, and hence that the bootstrap and level-shifter capacitors can be made smaller. It is to be understood that such and several other changes and variations may be incorporated without departing from the scope and spirit of this invention. Those who are skilled in the art will be able to generalize the disclosed concepts and make use of the invention in many embodiments and technologies.

To bring perspective to, and to ease the process of learning the invention, theoretical explanations has been provided for many phenomena. The theory is believed to be useful and correct, but the legal scope of this patent is not to depend upon the correctness of it.

Hence, the reader will understand that, although the description above contains many specifications, these should no be construed as limiting the scope of the invention, but as merely providing illustrations of some of the presently preferred embodiments. Thus the scope of this invention should be determined by the appended claims and their legal equivalents, rather than the given examples.

I claim:

1. An analog switching circuit comprising
   (a) a first switch terminal;
   (b) first switching means having a conductive channel defined between said first switch terminal and a first node, the conductivity of said conductive channel being responsive to difference in electrostatic potential between a control electrode and said conductive channel;
   (c) a bootstrap device providing an approximately constant voltage difference between a first electrode and a second electrode, said first electrode being coupled to said first node;
   (d) second switching means coupled between the second electrode of said bootstrap device and the control electrode of said first switching means, said second switching means being conductive when said first switching means is to be conductive;
   (e) third switching means coupled between the control electrode of said first switching means and a first voltage signal, said third switching means being conductive when said first switching means is to be nonconductive;
   (f) control means to control the second and third switching means;
   whereby the conductance between said first node and said first switch terminal is controllable by said control means.

2. The analog switching circuit of claim 1 wherein said bootstrap device includes
   (a) a voltage-storing device defined across a substantially insulating material, said voltage-storing device being coupled between said first electrode and said second electrode of said bootstrap device;
   (b) means to charge said voltage-storing device.

3. The analog switching circuit of claim 2 wherein said means to charge said voltage-storing device includes
   (a) fourth switching means coupled between said first electrode of said bootstrap device and a second voltage signal;
   (b) fifth switching means coupled between said second electrode of said bootstrap device and a third voltage signal.

4. The analog switching circuit of claim 3 further comprising a level shifter.

5. The analog switching circuit of claim 1 further including
   (a) a second switch terminal;
   (b) main switching means having a conductive channel defined between said first switch terminal and said second switch terminal,
   the conductivity of said main switching means being responsive to difference in electrostatic potential between a first control electrode and the conductive channel of said main switching means;
   the first control electrode of said main switching means being coupled to the control electrode of said first switching means;
   whereby the conductance between said first switch terminal and said second switch terminal can be controlled by said control means.

6. The analog switching circuit of claim 5 wherein
   (a) said main switching means comprises a first insulated-gate semiconductor providing a conductive channel of a first polarity between said first switch terminal and said second switch terminal;
   (b) said first switching means comprise a second insulated-gate semiconductor providing a conductive channel of the said first polarity.

7. The analog switching circuit of claim 6 wherein
   (a) said second switching means comprises a third insulated-gate semiconductor providing a conductive channel of a second polarity opposite of said first polarity.

8. The analog switching circuit of claim 7 wherein
   (a) said control means provides a control signal to a gate terminal of said third insulated-gate semiconductor; the electrostatic potential of said control signal having a substantially constant offset with respect to the electrostatic potential of the conductive channel of said third insulated-gate semiconductor when the channel is conducting.

9. The analog switching circuit of claim 5 wherein
   (a) the conductivity of the conductive channel of said main switching means further is responsive to difference in electrostatic potential between a second control electrode and the conductive channel;
   (b) said second control electrode of said main switching means is coupled to a biasing means;
   (c) when the main switching means is to be conductive, said biasing means maintains a substantially constant offset in electrostatic potential between the second control electrode and the conductive channel of the main switching means.

10. An analog-switch circuit comprising
    (a) a first switch terminal;
    (b) a second switch terminal;
    (c) first switching means having a conductive channel defined between said first switch terminal and said second switch terminal, the conductivity of said conductive channel being responsive to difference in electrostatic potential between a first control electrode and said conductive channel;
    (d) a bootstrap device providing an approximately constant voltage between a first electrode and a second electrode, said first electrode being coupled to said first control electrode of said first switching means;
    (e) second switching means coupled between said second electrode of said bootstrap device and said first switch terminal, said second switching means being conductive when said first switching means is to be conductive;
    (f) third switching means coupled between said first control electrode of said first switching means and a first voltage signal, said third switching means being conductive when said first switching means is to be nonconductive;
    (g) control means to control the second and third switching means,
    whereby the conductance between the two switch terminals is controllable by said control means.

11. The analog-switch circuit of claim 10 wherein said bootstrap device includes
    (a) a voltage-storing device defined across an substantially insulating material, said voltage-storing device being coupled between said first electrode and said second electrode of said bootstrap device;

(b) means to charge said voltage-storing device.

12. The analog-switch circuit of claim 11 wherein said means to precharge said voltage-storing device includes (a) fourth switching means coupled between said second electrode of said bootstrap device and a second voltage signal.

13. The analog-switch circuit of claim 12 wherein the difference in electrostatic potential between the first voltage signal and the second voltage signal is substantially constant when said voltage-storing device is being charged.

14. The analog-switch circuit of claim 11 further including a levelshifter.

15. The analog-switch circuit of claim 10 wherein said first switching means comprise a first insulated-gate semiconductor of a first polarity having a conductive channel defined between said first switch terminal and said second switch terminal.

16. The analog-switch circuit of claim 15 wherein said second switching means comprises a series connection wherein at least one link is a second insulated-gate semiconductor of a second polarity opposite of said first polarity.

17. The analog-switch circuit of claim 15 wherein said second switching means comprises a parallel combination of two insulated-gate semiconductors of opposite polarity.

18. The analog-switch circuit of claim 10 wherein:

(a) the conductivity of the conductive channel of said first switching means further is responsive to difference in electrostatic potential between a second control electrode and said conductive channel;

(b) said second control electrode is controlled by a biasing means.

19. The analog-switch circuit of claim 18 wherein said biasing means is an electrical coupling between said second control electrode and the second electrode of said bootstrap device.

20. The analog-switch circuit of claim 18 wherein said biasing means comprises a fifth switching means of substantially the same type as said first switching means, said fifth switching means having a control electrode coupled to said first control electrode of said first switching means.

21. A method for controlling a first switching means comprising the steps of (a) providing a first node having approximately the same electrostatic potential as a first signal applied to said first switching means; said first signal being characterized by its electrostatic potential with respect to the electrostatic potential of a reference node (b) providing a second switching means having a conductive channel defined between said first node and a second node, the conductivity of said conductive channel being responsive to difference in electrostatic potential between a control electrode and said conductive channel;

(c) providing a bootstrap device having a first electrode and a second electrode, said first electrode of said bootstrap device being coupled to said second node;

(d) coupling said control electrode of said second switching means to said second electrode of said bootstrap device when said first switching means is to be conductive;

(e) coupling said control electrode of said second switching means to a voltage signal when said first switching means is to be nonconductive;

whereby said control electrode of said second switching means provides a signal suitable for control of said first switching means.

* * * * *